United States Patent [19]

Wong

[11] Patent Number: 6,044,482
[45] Date of Patent: Mar. 28, 2000

[54] DIGITAL TRANSMISSION SYSTEM FOR ENCODING AND DECODING ATTRIBUTE DATA INTO ERROR CHECKING SYMBOLS OF MAIN DATA

[75] Inventor: Wing Tak Kenneth Wong, Kwai Chung, The Hong Kong Special Administrative Region of the People's Republic of China

[73] Assignee: British Telecommunications public limited company, London, United Kingdom

[21] Appl. No.: 08/849,319

[22] PCT Filed: Dec. 12, 1995

[86] PCT No.: PCT/GB95/02892

§ 371 Date: Jul. 21, 1997

§ 102(e) Date: Jul. 21, 1997

[87] PCT Pub. No.: WO96/19054

PCT Pub. Date: Jun. 20, 1996

[30] Foreign Application Priority Data

Dec. 12, 1994 [EP] European Pat. Off. .............. 94309306

[51] Int. Cl.⁷ .......................... H03M 13/00; H03M 1/00; G06F 11/10
[52] U.S. Cl. ......................... 714/758; 714/785; 714/759; 714/755
[58] Field of Search .................................. 371/37.4, 37.7, 371/37.07, 37.12, 37.01, 37.8; 714/785, 759, 755, 758

[56] References Cited

U.S. PATENT DOCUMENTS

| | | | |
|---|---|---|---|
| 3,466,601 | 9/1969 | Tong | 340/146.1 |
| 3,745,526 | 7/1973 | Hong et al. | 714/785 |
| 4,271,520 | 6/1981 | Coombes et al. | . |
| 5,003,539 | 3/1991 | Takemoto et al. | 371/37 |
| 5,325,372 | 6/1994 | Ish-Shalom | 714/758 |
| 5,428,643 | 6/1995 | Razzell | 375/308 |
| 5,430,739 | 7/1995 | Wei et al. | 714/756 |
| 5,588,122 | 12/1996 | Garcia | 710/52 |

FOREIGN PATENT DOCUMENTS

| | | |
|---|---|---|
| 0396403 | 11/1990 | European Pat. Off. . |
| 2139050 | 10/1984 | United Kingdom . |
| WO A 8706368 | 10/1987 | WIPO . |
| WO A 93 12598 | 6/1993 | WIPO . |

OTHER PUBLICATIONS

Chang et al, "Performance of a TDMA Portable Radio System Using a Cyclic block Code for Burst Synchronizationand Error Detection", IEEE Transactions on Communications, vol. 41, No. 1, Jan. 1993, New York, US.

Forney, "On the Hamming Distance Properties of Group Codes", IEEE Transactions on Information Theory, vol. 38, No. 6, Nov. 1992, New York, US.

Patent Abstracts of Japan, vol. 15, No. 269 (E–1087), Jul. 9, 1991 & JP,A,03 089630 (Matsushita Electric Industrial Co.), Apr. 15, 1991.

Patent Abstracts of Japan, vol. 14, No. 368 (E–0962), Aug. 9, 1990 & JP,A,02 131625 (Matsushita Electric Industrial Co.), May 21, 1990.

Patent Abstracts of Japan, vol. 15, No. 119 ({–1183), Mar. 22, 1991 & JP,A,03 008175 (Sony Corp.), Jan. 16, 1991.

*Primary Examiner*—William Grant
*Assistant Examiner*—Iván Calcaño
*Attorney, Agent, or Firm*—Nixon & Vanderhye P.C.

[57] ABSTRACT

Data are coded with a first error correcting code to produce first coded bits. Control data are coded using a heavily redundant second error corrected code and added modulo 2 to the first coded bits. Decoding is performed by ascertaining which valid codeword of the second code (when added to the received codeword) gives the lowest error count when the resultant is decoded according to the first code.

8 Claims, 1 Drawing Sheet

DIGITAL TRANSMISSION SYSTEM FOR ENCODING AND DECODING ATTRIBUTE DATA INTO ERROR CHECKING SYMBOLS OF MAIN DATA

BACKGROUND OF THE INVENTION

1. Field of the Invention

The present application is concerned with the transmission of data using forward error correction, that is, where data are encoded using a redundant code such that, upon reception in the presence of errors, the fact that errors have occurred can be recognised at a receiver, and preferably (up to a maximum tolerable error rate) corrected.

The context particularly addressed is where a requirement exists to transmit also auxiliary data also requiring a high level of error protection.

2. Related Art

Error correction coding techniques of many different types have long been used. Some, such as represented by U.S. Pat. No. 5,003,539 (WO,A,87 06368) even use two levels of coding to cause error correction coding to carry additional data. Others use only one level (e.g., U.S. Pat. Nos. 4,271,529 and 3,466,601). Other coding/decoding techniques for conveying extra signalling capacity are also known (e.g., WO,A,93 12598).

SUMMARY OF THE INVENTION

According to one aspect of the invention there is provided an apparatus for decoding data which has been coded by coding first data in accordance with a first redundant code to produce first coded bits, coding second data in accordance with a second redundant code to produce second coded bits, and adding the second coded bits to the first coded bits, the apparatus comprising:

means operable for received data to determine in accordance with the first code a plurality of error values each corresponding to the assumption that the second coded bits constitute a respective one of a plurality of allowed codewords of the second code;

means to output a signal identifying that one of the said allowed codewords which corresponds to the smallest error value;

means for removing from the received data the effects of the identified codeword to produce modified data; and means for decoding the modified data in accordance with the first redundant code.

Preferably the first code is a systematic code so that the first coded bits comprise the fit data bits and parity bits, the second coded bits being added only to the parity bits, and the means operable to determine error values comprises (a) means to compute the syndrome of the received data in accordance with the first code; and (b) means to compare the syndrome with each valid codeword of the second redundant code, the error value being the Hamming distance between the codeword and the syndrome.

In another aspect of the invention there is provided an apparatus for coding data for transmission comprising:

coding means for receiving first data for transmission and coding the data in accordance with a first redundant code to produce first coded bits for transmission;

coding means for receiving second data for transmission and coding the data in accordance with a second redundant code to produce second coded bits for transmission;

means for adding the second coded bits to the first coded bits.

BRIEF DESCRIPTION OF THE DRAWINGS

Some embodiments of the invention will now be described, by way of example, with reference to the accompanying drawings, in which.

DETAILED DESCRIPTION OF EXEMPLARY EMBODIMENTS

This example supposes that, for each successive data frame of 96 bits each, a requirement exists to transmit 51 data bits, and that these bits are to be coded using a (96, 51) burst error correcting cyclic code. This is a systematic code—i.e. the data bits themselves are unchanged by the coding, so that it requires the transmission of 51 data bits plus 45 parity bits. Its generator polynomial is $x^{45}+x^{40}+x^{35}+x^{25}+x^{20}+x^5+1$. Such codes are conventional, as is their decoding using error-correction techniques.

Figure 1:
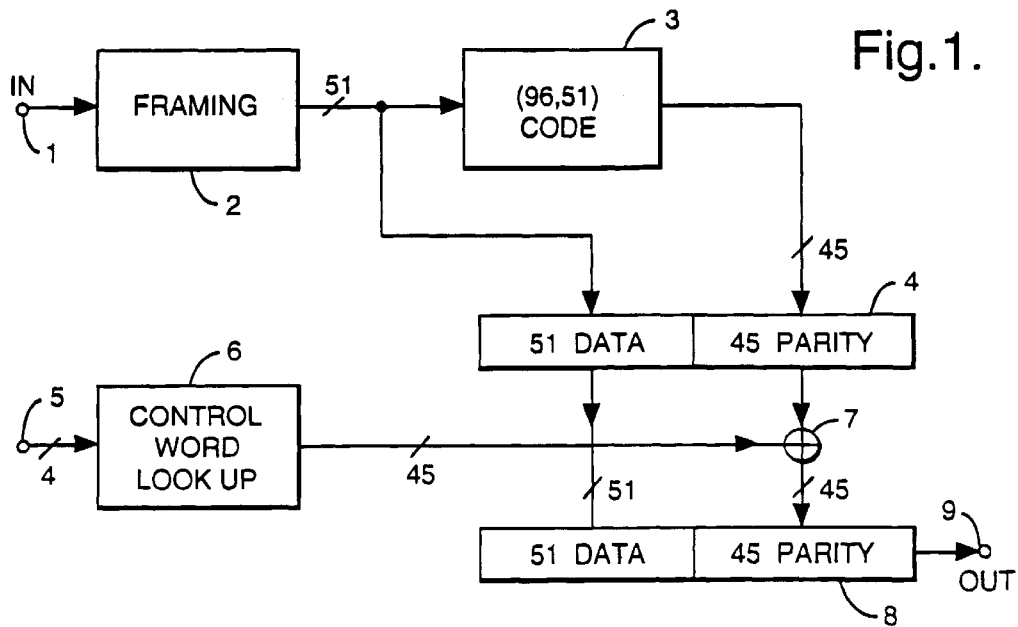
FIG. 1 is a block diagram of one form of data coding apparatus according to the invention.

Thus in FIG. 1, user data input at an input 1 are formatted in a framing unit 2 into groups of 51 bits which are supplied to a coder 3 for the cyclic code to generate 45 parity bits. As shown, the data and parity bits are assembled in a register 4. For clarity, internal data paths in the apparatus of FIG. 1 are shown as parallel connections, but the signals may be processed sequentially using standard digital signal processing techniques, if desired.

It is supposed, further, that there is a requirement to transmit auxiliary data, for example for control of remote equipment such as a modem, and that eleven such control words are desired, with a heavy level of error protection so that they may be recognised correctly at a receiver in the presence of transmission errors. In addition, no further transmission capacity is available over and above the 96 bits already mentioned.

The apparatus achieves this by generating one of eleven predetermined 45-bit control words, and adding these bits modulo-2 to the 45 parity bits in the register 4. Thus in FIG. 1 an input 5 identifies an entry in a look-up table store 6 which contains a set of eleven control words; the selected entry is combined with the 45 parity bits from the register 4 using exclusive -OR gates 7. The resulting modified bits are assembled with the 51 data bits in a further register 8, from which they are output in a desired format to an output 9.

Figure 2:
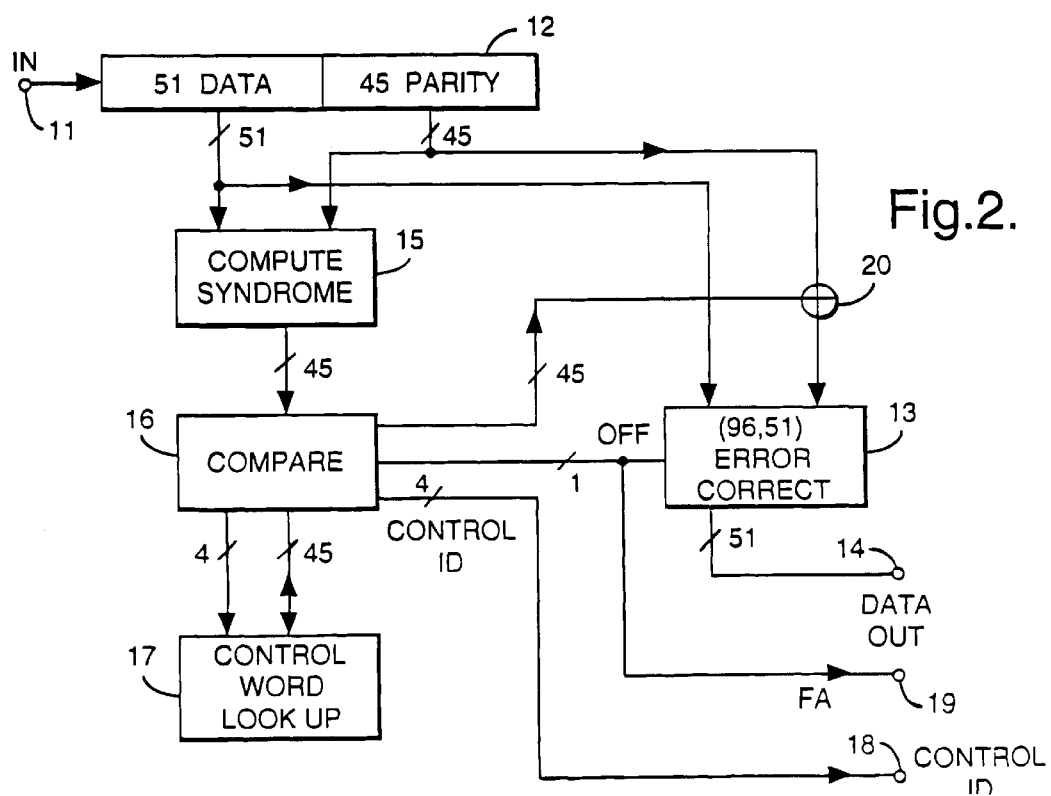
FIG. 2 is a corresponding decoder.

The corresponding receiver is shown in FIG. 2 where the signals are received at an input 11 and the data and parity bits are assembled in respective sections of a register 12. These bits are supplied to a decoder 13 which applies the same (96, 51) cyclic code to correct errors and supply corrected data at an output 14.

On the face of it, addition of this extra information to the parity bits might be expected to destroy or at least weaken the capacity of a receiver to detect and correct errors in the received data. However the receiver works on the premise that if the control word sent can be correctly identified at the receiver from an examination of the received data and parity bits, then that word can be subtracted from the parity bits and thereupon error correction can be performed as if no control word had ever been sent. Correct recognition is thus crucial since misrecognition will result in subtraction of the wrong codeword and in most cases result in serious corruption of the data. To minimise the risk of this:

a large number of bits have been chosen for the control word (relative to the number of words in the set);

the control words should be as different as possible from one another. This implies that the control codewords should be selected so that the Hamming distance between any two codewords is as large as possible The following table lists eleven suitable 45 bit words having a minimum Hamming distance between any two words of 24.

| Index | Control Codewords |
|---|---|
| 0 | 000000000000000000000000000000000000000000000 |
| 1 | 000100110101111000100110101111000100110101111 |
| 2 | 001001101011100010011010111100010011010111110 |
| 3 | 001101011110001001101011110001001101011110001 |
| 4 | 010011010111100010010111100010010111100011100 |
| 5 | 010111100010011010111100010011010111100010011 |
| 6 | 011010111100010011010111100010011010111100010 |
| 7 | 011110001001101011110001001101011110001001101 |
| 8 | 100010011010111100010011010111100010011010111 |
| 9 | 100110101111000100110101111000100110101111000 |
| 10 | 101011110001001101011110001001101011110001001 |

In general, for m-bit control codewords the Hamming distance should preferably be at m/3, and ideally at least m/2.

In principle the control codeword may be recognised by (a) subtracting a codeword from parity bits;

(b) apply the relevant decoding process to the data plus parity bits to ascertain the number of bits that are in error;

(c) repeating (a) and (b) for the other codewords;

(d) selecting the codeword giving the lowest error count (if there are no transmission errors this will be zero, of course).

In some cases it may be necessary to follow this procedure. In the embodiment of FIG. 2, however, because (i) a systematic code is used;

(ii) the control word is added only to the parity bits; a more rapid method is proposed.

To appreciate this method it is helpful to consider the mathematical representation of the coding decoding process.

With an (n,k) cyclic code, the parity bits R(x) are the remainder of the k information bits divided by the generator polynomial G(x) (note that, for systematic codes, D(x) here represents the data shifted left by n−k—i.e. with n−k trailing zeros). Thus $$D(x)=Q(x)G(x)+R(x) \quad (1)$$

where Q(x) is the quotient and "+" represents bit-by-bit modulo-2 addition. The n bit coded result C(x) is then $$C(x)=D(x)+R(x) \quad (2)$$

Suppose at a decoder, the received word is C'(x); we then compute the syndrome which is the remainder when C'(x) is divided by G(x).

Under error free conditions $$C'(x) = C(x) = D(x) + R(x) \quad (3)$$

$$= Q(x)G(x) + R(x) + R(x) \quad (4)$$

$$= Q(x)G(x) \quad (5)$$

and therefore C'(x) is divisible by G(x) and the syndrome or remainder of one division is zero.

When C'(x) contains detectable errors, the syndrome is not zero.

Consider now the situation when a control word is added to C(x) before transmission; let it be the ith control word $I_i(x)$.

Hence, equation (2) becomes $$C(x)=D(x)+R(x)+I_i(x) \quad (6)$$

Therefore at the receiver a search process is needed in which each possible control word is subtracted from the received signal and the syndrome computed.

$$S_j(x)=REM[(C'(x)+I_j(x))/G(x)] j=1 \ldots B \quad (7)$$

where B is the size of the control word table (equal to 11 in this example) and the desired word is (under error-free conditions) that for which $S_j(x)$ is zero.

Unfortunately, in the presence of errors C'(x)=C(x)+E(x); equation (2) becomes $$S_j(x)=REM[(C(x)+E(x)+I_j(x))/G(x)] \quad (8)$$

where E(x) is an error pattern introduced by the transmission channel. This represents a danger of misrecognition if E(x)+$I_j(x)=I_k(x)$ for some values of j,k. This risk can be minimised by maximising the Hamming distance between the control words, as mentioned above.

In the decoder of FIG. 2, the syndrome S(x) is computed, without subtraction of a control word, in a unit 15, i.e.

$$S(x) = REM[C'(x)/G(x)]$$

$$= REM[(D(x) + R(x) + E(x) + I_i(x))/G(x)]$$

As D(x)+R(x) is divisible by G(x) (equations 3–5 above) S(x) is actually equal to $$S(x)=REM[(E(x)+I_i(x)/G(x))]$$

If E(x)=0 then $S(x)=I_i(x)$, otherwise S(x) will differ from $I_i(x)$ in a number of bit positions, depending on the amount of error. Thus the syndrome S(x) is compared in a comparator 16 with each of the eleven control words from a control word store 17 to ascertain the word having the shortest Hamming distance with S(x) and this word $I_i(x)$ is output along with an identity signal ID identifying this word to a control signal output 18. If this best Hamming distance is greater than 9 (i.e. if fewer than 36 bits match) however, the comparator 16 produces an alarm signal FA at an output 19 to indicate that control word recognition is unreliable.

The output control word is subtracted in a subtractor 20 from the received parity bits prior to their receipt by the error correction circuit 13.

In the event that the alarm signal FA is produced this could suppress the operation of the error correction circuit 13 so that the data bits pass unmodified to the output 14 (the uncorrected data bits will generally be more useful than they would be after correction using the corrupted parity bits).

Also the alarm signal output 19 can signal to following equipment that the ID output 18 is invalid and that the data output at 14 are uncorrected.

In the case that misrecognition of the control word does occur, for example $I_i(x)$ is assumed instead of $I_j(x)$, then the syndrome will be corrupted by the pattern $I_i(x)-I_j(x)$.

In tests, it is found that, using the particular code and control words described, produced no instances of incorrect control word recognition (i.e. all misdetections were identified by the alarm signal) even at high channel error rates. However, it is noted that (assuming that the number of channel errors is within the range which the code in use is capable of correcting) some values of the syndrome correspond to errors only in the parity bits, whilst others correspond to data errors.

It is therefore possible to choose the control words so that the effect of $I_i(x)\div I_j(x)$ (for all i,j) is to simulate only parity-bit errors, so that undetected misrecognition of control words does not result in data corruption—at least for some error patterns. However, selection of the control words in this way will reduce the Hamming distance between the control words, so that the risk of undetected misrecognition will be increased. Clearly there is a trade-off between these two factors.

I claim:

1. An apparatus for decoding data which has been coded by coding first data in accordance with a first redundant code having a plurality of allowed codewords to produce first coded bits, coding second data in accordance with a second redundant code having a smaller plurality of allowed codewords to produce second coded bits, and adding the second coded bits to the first coded bits, the apparatus comprising:

means operable for received data to determine, in accordance with the first code, a plurality of error values each corresponding to the assumption that the second coded bits constitute a respective one of the plurality of allowed codewords of the second code;

means to output a signal identifying that one of the said allowed codewords which corresponds to the smallest error value even if it is a non-zero value;

means controlled by said output signal for removing from the received data the effects of the identified codeword to produce modified data; and means for decoding the modified data in accordance with the first redundant code.

2. An apparatus as in claim 1 in which the first code is a systematic code so that the first coded bits comprise the first data bits and parity bits, the second coded bits being added only to the parity bits, and in which the means operable to determine error values comprises:

(a) means to compute the syndrome of the received data in accordance with the first code; and (b) means to compare the syndrome with each valid codeword of the second redundant code, the error value being the Hamming distance between the codeword and the syndrome.

3. An apparatus as in claim 2 in which the comparing means is operable to produce an alarm signal if the said smallest Hamming distance is greater than a predetermined threshold value.

4. An apparatus as in claim 3 in which the decoding means is responsive to presence of the alarm signal to suppress error correction.

5. A method for decoding data which has been coded by coding first data in accordance with a first redundant code having a plurality of allowed codewords to produce first coded bits, coding second data in accordance with a second redundant code having a smaller plurality of allowed codewords to produce second coded bits, and adding the second coded bits to the first coded bits, the method comprising:

processing received data to determine, in accordance with the first code, a plurality of error values each corresponding to the assumption that the second coded bits constitute a respective one of the plurality of allowed codewords of the second code;

outputting a signal identifying that one of the said allowed codewords which corresponds to the smallest error value even if it is a non-zero value;

in response to said output signal, removing from the received data the effects of the identified codeword to produce modified data; and decoding the modified data in accordance with the first redundant code.

6. A method as in claim 5 wherein the first code is a systemtic code so that the first coded bits comprise the first data bits and parity bits, the second coded bits being added only to the parity bits, and in which the processing step comprises:

(a) computing the syndrome of the received data in accordance with the first code; and (b) comparing the syndrome with each valid codeword of the second redundant code, the error value being the Hamming distance between the codeword and the syndrome.

7. A method as in claim 6 wherein comparing step produces an alarm signal if the said smallest Hamming distance is greater than a predetermined threshold value.

8. A method as in claim 7 wherein the decoding step is responsive to presence of the alarm signal to suppress error correction.

* * * * *